US012367420B2

(12) United States Patent
Divakaran et al.

(10) Patent No.: US 12,367,420 B2
(45) Date of Patent: Jul. 22, 2025

(54) USER TARGETED CONTENT GENERATION USING MULTIMODAL EMBEDDINGS

(71) Applicant: SRI International, Menlo Park, CA (US)

(72) Inventors: Ajay Divakaran, Monmouth Junction, NJ (US); Karan Sikka, Lawrenceville, NJ (US); Arijit Ray, Princeton, NJ (US); Xiao Lin, Princeton, NJ (US); Yi Yao, Princeton, NJ (US)

(73) Assignee: SRI International, Menlo Park, CA (US)

( * ) Notice: Subject to any disclaimer, the term of this patent is extended or adjusted under 35 U.S.C. 154(b) by 1114 days.

(21) Appl. No.: 17/191,698

(22) Filed: Mar. 4, 2021

(65) Prior Publication Data

US 2021/0297498 A1   Sep. 23, 2021

Related U.S. Application Data

(60) Provisional application No. 62/991,813, filed on Mar. 19, 2020.

(51) Int. Cl.
*G06N 20/00* (2019.01)
*G06F 17/16* (2006.01)
(Continued)

(52) U.S. Cl.
CPC ............. *G06N 20/00* (2019.01); *G06F 17/16* (2013.01); *G06F 30/27* (2020.01); *G06N 3/02* (2013.01)

(58) Field of Classification Search
CPC .......... G06N 20/00; G06N 3/02; G06F 30/27; G06F 17/16
See application file for complete search history.

(56) References Cited

U.S. PATENT DOCUMENTS

2019/0325342 A1* 10/2019 Sikka ................... G06F 18/22
2021/0065260 A1* 3/2021 Zheng ............... G06Q 30/0282

OTHER PUBLICATIONS

Elkahky et al., A Multi-View Deep Learning Approach for Cross Domain User Modeling in Recommendation Systems, WWW 2015, May 2015. (Year: 2015).*

(Continued)

*Primary Examiner* — Marshall L Werner
(74) *Attorney, Agent, or Firm* — Moser Taboada

(57) ABSTRACT

A method, apparatus and system for determining user-content associations for determining and providing user-preferred content using multimodal embeddings include creating an embedding space for multimodal content by creating a first modality vector representation of the multimodal content having a first modality, creating a second modality vector representation of the multimodal content having a second modality, creating a user vector representation, as a third modality, for each user associated with at least a portion of the multimodal content, and embedding the first and the second modality vector representations and the user vector representations in the common embedding space using at least a mixture of loss functions for each modality pair of the first, the at least second and the third modalities that pushes closer co-occurring pairs of multimodal content. Embodiments can further include generating content using determined attributes of a message to be conveyed and features of the user-preferred content.

20 Claims, 12 Drawing Sheets

(51) Int. Cl.
*G06F 30/27* (2020.01)
*G06N 3/02* (2006.01)

(56) References Cited

OTHER PUBLICATIONS

Kim, Yoon, Convolutional Neural Networks for Sentence Classification, Sep. 2014. (Year: 2014).*
Cheng et al., XBully: Cyberbullying Detection within a Multi-Modal Context, WSDM '19, pp. 339-347, Feb. 2019. (Year: 2019).*
Sikka, K., Bramer L., Divakaran, A. (2019). Deep Unified Multimodal Embeddings for Understanding both Content and Users in Social Media Networks. arXiv.
Kruk, J., Lubin, J., Sikka, K., Lin, X., Jurafsky, D., Divakaran, A. (2019). Integrating Text and Image: Determining Multimodal Document Intent in Instagram Posts. arXiv 2019.
Seymour, Z., Sikka, K., Chiu, H., Samarasekera, S., Kumar, T. (2019). Semantically-Aware Attentive Neural Embeddings for Image-based Visual Localization. British Machine Vision Conference. (BMVC).
Bansal, A., Sikka, K., Sharma, G., Chellapa, R., Divakaran, A. (2018). Zero-Shot Object Detection. European Conference on Computer Vision (ECCV).
Ahuja, K., Sikka, K., Roy, A., Divakaran, A. (2018). Understanding Visual Ads by Aligning Symbols and Objects using Co-Attention. Computer Vision and Pattern Recognition Workshops. (CVPRW).
Datta, S., Sikka, K., Roy, A., Ahuja, K., Parikh, D., Divakaran, A. (2019). Align2Ground: Weakly Supervised Phrase Grounding Guided by Image-Caption Alignment. arXiv.
Elkahky, et al. A multi-view deep learning approach for cross domain user modeling in recommendation systems. In: International Conference on World Wide Web, (2015).
Zhang et al. Joint representation learning for top-n recommendation with heterogeneous information sources. In: Conference on Information and Knowledge Management (2017).
Hong, L., Dan, O., and Davison, B. D., "Predicting popular messages in twitter." In WWW, 2011.
Szabo, G., and Huberman, B. A., "Predicting the popularity of online content." Communications of the ACM, 53(8):80-88, 2010.
Ma, Z., Sun, A., and Cong, G., "On predicting the popularity of newly emerging hashtags in twitter." Journal of the American Society for Information Science and Technology, 2013.
Weston, J., Bengio, S. and Usunier, N., "Large scale image annotation: learning to rank with joint word-image embeddings." Machine learning, 81(1), pp. 21-35, 2010.

\* cited by examiner

| Modality pairs used for training | | | Regularization Parameters $(\lambda_1, \lambda_2, \lambda_3)$ | Mean Median Rank Cross-Modal Retrieval | | |
|---|---|---|---|---|---|---|
| Text-User | Image-Text | Image-User | | Text-To-User | Image-To-Text | Image-To-User |
| Random | | | | 19904 | 2500 | 19904 |
| Single Modality Pair | | | | | | |
| ✓ | | | (1, 0, 0) | 371 | 2291 | 21873 |
| | ✓ | | (0, 1, 0) | 20212 | 149 | 20289 |
| | | ✓ | (0, 0, 1) | 19808 | 2491 | 1407 |
| Two Modality Pairs | | | | | | |
| ✓ | ✓ | | (0.5, 0.5, 0) | 420 | 154 | 2455 |
| ✓ | | ✓ | (0.5, 0, 0.5) | 383 | 239 | 664 |
| | ✓ | ✓ | (0, 0.5, 0.5) | 8427 | 138 | 1181 |
| All Modality Pairs | | | | | | |
| ✓ | ✓ | ✓ | (0.333, 0.333, 0.333) | 450 | 144 | 980 |
| ✓ | ✓ | ✓ | (0.05, 0.2, 0.75) | 732 | 140 | 806 |
| ✓ | ✓ | ✓ | (0.1, 0.45, 0.45)* | 551 | 127 | 785 |

| Method | Modalities used | | F1-score |
| --- | --- | --- | --- |
| | Text | Image | |
| Random | | | 0.00 |
| Baseline | | | |
| Avg-Text | ✓ | | 0.40 |
| Avg-Image | | ✓ | 0.45 |
| DU2MCE (Proposed) | | | |
| Text-User pair | ✓ | | 0.47 |
| Image-User pair | | ✓ | 0.49 |
| All modality pairs | ✓ | ✓ | 0.52 |

USER TARGETED CONTENT GENERATION USING MULTIMODAL EMBEDDINGS

CROSS-REFERENCE TO RELATED APPLICATIONS

This application claims benefit of and priority to U.S. provisional patent application Ser. No. 62/991,813, filed Mar. 19, 2020, which is herein incorporated by reference in its entirety.

GOVERNMENT RIGHTS

This invention was made with Government support under Contract W81XWH-17-C-0083 awarded by the Department of Defense. The Government has certain rights in the invention.

FIELD

Embodiments of the present principles generally relate to the evaluation and generation of content, and more particularly, to embodiments of methods, apparatuses, and systems for determining and providing user-preferred content using multimodal embedding.

BACKGROUND

User interaction with content can sometimes be used to infer or determine user preference for content. Such user interaction with content can come in the form of internet applications, such as social media applications, video sharing and streaming applications, audio (e.g., music) sharing and streaming applications, word and phrase sharing applications (e.g., texting, word games), and the like.

Current approaches for attempting to determine user preference for content based on a user's interaction with content rely on coarse polling and intuition-based methods that do not link content and users in a precise mathematical model. That is, fine-grained association of content with users is not currently possible.

SUMMARY

Embodiments of methods, apparatuses and systems for determining and providing user-preferred content using multimodal embedding are disclosed herein.

In some embodiments in accordance with the present principles, a method for creating a common embedding space for multimodal content for determining user interests, includes for each of a plurality of content of the multimodal content, creating a respective first modality vector representation of the content of the multimodal content having a first modality using a machine learning model, for each of a plurality of content of the multimodal content, creating a respective second modality vector representation of content of the multimodal content having a second modality using a machine learning model, creating a respective user vector representation, as a third modality, for each user associated with at least a portion of the multimodal content using information regarding a respective portion of the multimodal content associated with each user, and embedding the first modality vector representations, the second modality vector representations and the user vector representations in a common embedding space using at least a mixture of loss functions for each modality pair of the first, the second and the third modalities that pushes closer co-occurring pairs of multimodal content.

In some embodiments in accordance with the present principles, a method for predicting user content preferences of multimodal content in a multimodal content database using a trained embedding space having embedded therein a plurality of user vector representations, includes identifying a user for which to predict user content preferences of the multimodal content, locating an embedded vector representation of the identified user in the trained embedding space, determining a similarity between the embedded user vector representation and embedded vector representations of multimodal content in the trained embedding space using a distance function to identify user multimodal content preferences, and comparing the identified user multimodal content preferences to multimodal content in the multimodal content dataset to predict user content preferences of multimodal content in the multimodal content dataset.

In some embodiments in accordance with the present principles, a method for using determined user preferred content for conveying message intents includes determining features of an intent of a message to be conveyed using the user preferred content using a first pre-trained embedding space, determining features of the user preferred content for conveying the message intent using a second pre-trained embedding space, and generating content using the determined features of the intent of the message to be conveyed and the determined features of the user preferred content for conveying the desired message intent using the user preferred content.

In some embodiments in accordance with the present principles, an apparatus for creating a common embedding space for multimodal content for determining user interests includes a first embedding module creating a respective first modality vector representation of the content of the multimodal content having a first modality using a machine learning model for each of a plurality of content of the multimodal content, at least a second embedding module creating at least a respective second modality vector representation of content of the multimodal content having at least a second modality using a machine learning model for each of a plurality of content of the multimodal content, a user embedding module creating a respective user vector representation, as a third modality, for each user associated with at least a portion of the multimodal content using information regarding a respective portion of the multimodal content associated with each user, and a matching module embedding the first modality vector representations, the at least second modality vector representations and the user vector representations in a common embedding space using at least a mixture of loss functions for each modality pair of the first, the at least second and the third modalities that pushes closer co-occurring pairs of multimodal content.

In some embodiments of the apparatus in accordance with the present principles, the matching module, upon identification of a user for which to predict user content preferences of the multimodal content, locates an embedded user vector representation of the identified user in the embedding space, determines a similarity between the located, embedded user vector representation and embedded vector representations of the first and at least the second modalities in the embedding space using a distance function to identify user multimodal content preferences and compares the identified user multimodal content preferences to multimodal content in a multimodal content dataset to predict user content preferences of multimodal content in the multimodal content dataset.

In some embodiments of the apparatus in accordance with the present principles, the matching module includes a discriminator determining features of an intent of a message to be conveyed using the user preferred content using a first pre-trained embedding space and determining features of the user preferred content for conveying the message intent using a second pre-trained embedding space, and a generator generating content using the determined features of the intent of the message to be conveyed and the determined features of the user preferred content for conveying the desired message intent using the user preferred content.

Other and further embodiments in accordance with the present principles are described below.

BRIEF DESCRIPTION OF THE DRAWINGS

So that the manner in which the above recited features of the present principles can be understood in detail, a more particular description of the principles, briefly summarized above, may be had by reference to embodiments, some of which are illustrated in the appended drawings. It is to be noted, however, that the appended drawings illustrate only typical embodiments in accordance with the present principles and are therefore not to be considered limiting of its scope, for the principles may admit to other equally effective embodiments.

FIG. 4 depicts a Table of cross-modal retrieval results in an experiment for Twitter and Instagram datasets for combinations of different modalities used for training a common embedding space in accordance with an embodiment of the present principles.

FIG. 5 depicts a Table of comparisons of resulting F1 scores of a Naïve Baseline versus resulting F1 scores of single modality pair embeddings and versus resulting F1 scores of a combination of at least three modality pair embeddings in accordance with embodiments of the present principles.

Figure 1:
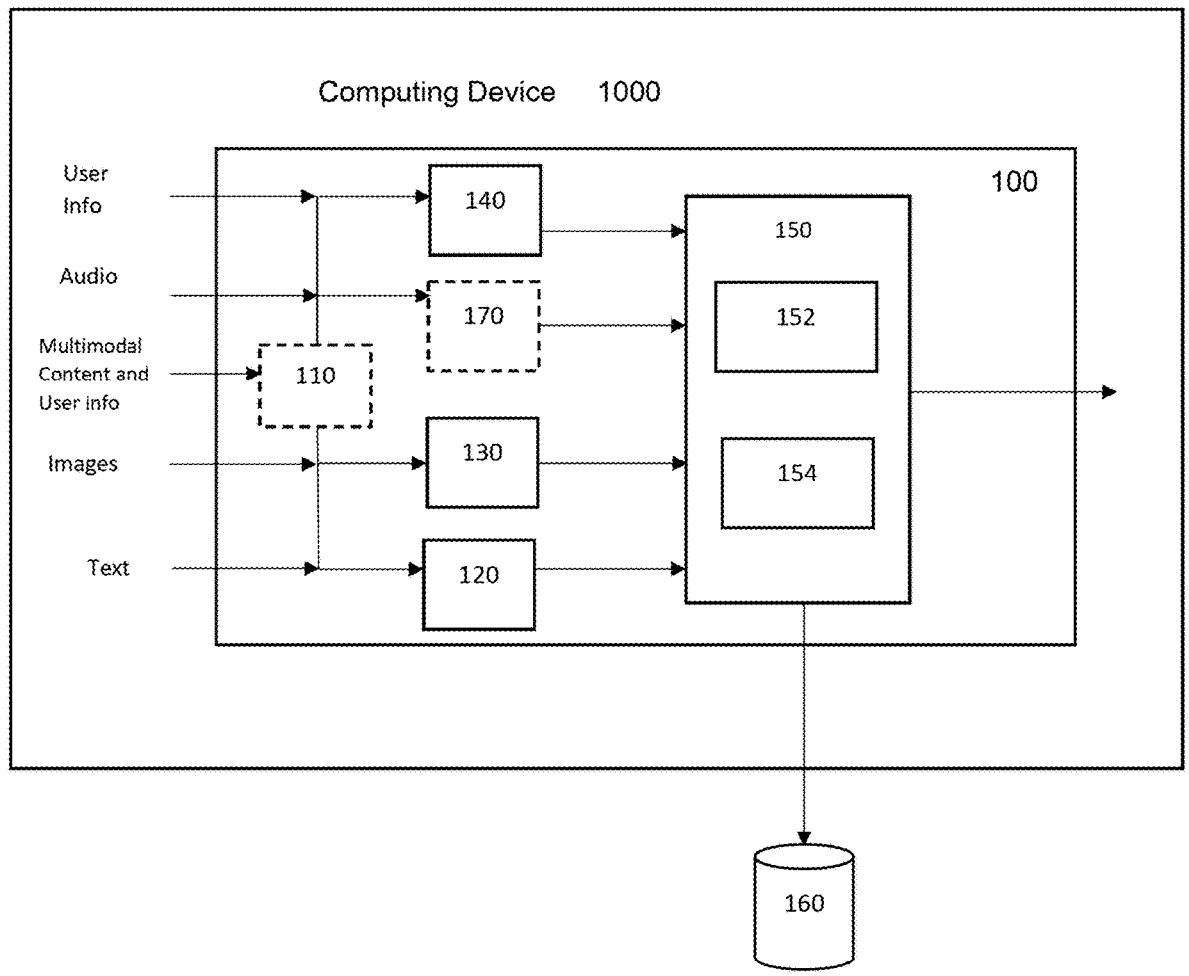
FIG. 1 depicts a high-level block diagram of a user content preference system 100 in accordance with an embodiment of the present principles.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of the present principles generally relating to methods, apparatuses and systems for determining and providing user-preferred content using multimodal embeddings. While the concepts of the present principles are susceptible to various modifications and alternative forms, specific embodiments thereof are shown by way of example in the drawings and are described in detail below. It should be understood that there is no intent to limit the concepts of the present principles to the particular forms disclosed. On the contrary, the intent is to cover all modifications, equivalents, and alternatives consistent with the present principles and the appended claims. For example, although embodiments of the present principles will be described primarily with respect to specific forms of multimodal user content derived from social media and in some embodiments for the use in targeted advertising, such teachings should not be considered limiting. Embodiments in accordance with the present principles can be implemented using other modes of user content derived from substantially any user source and for deriving content to be used for any purposes within the concepts of the present principles.

Embodiments in accordance with the present principles provide methods, apparatuses and systems for determining and providing user-preferred content using multimodal embeddings. In some embodiments, a method and system for determining and providing user-preferred content in accordance with the present principles uses multimodal embeddings to embed users and content in a same embedding space. In such embodiments it is possible to identify content that is of interest to users as well as generate content by retrieving high interest content based on the embeddings.

Throughout the teachings herein, the phrase "content associated with a user(s)" and the like is intended to define content with which a user(s) interacts whether the content be uploaded by a user(s), downloaded by a user(s), liked by a user(s), disliked by a user(s), generated by a user(s), retweeted by a user(s) and the like.

FIG. 1 depicts a high-level block diagram of a user content preference system 100 for determining and providing user-preferred content using multimodal embedding in accordance with an embodiment of the present principles. The user content preference system 100 of FIG. 1 illustratively comprises an optional content consumption monitoring (CCM) module 110, a text embedding module 120, an image embedding module 130, and a user(s) embedding module 140. As illustrated in the embodiment of FIG. 1, a user content preference system in accordance with the present principles can further comprise a matching module 150 and a searchable storage 160. In some embodiments in accordance with the present principles, a user content preference system, such as the user content preference system 100 of FIG. 1, can further comprise an optional audio embedding module 170. In some embodiments and as specifically depicted in the user content preference system 100 of FIG. 1, the matching module 150 can further comprise a generator module 152 and a discriminator module 154, the functions of which will be described further below.

In some embodiments, multimodal content (e.g., video images, audio, text and the like) associated with a user(s) and information regarding a user(s) can be monitored and separated by the optional CCM module 110, into different modalities, such as, text, images, audio, user information and the like, and can be communicated to an appropriate embedding module. That is, in some embodiments the optional CCM module 110 can monitor a user's interaction with content associated with, for example, a social media site. Image portions of the content can be communicated to the image embedding module 130 for embedding into a common embedding space as described below, text portions of the content can be communicated to the text embedding module 120 for embedding into the common embedding space as described below, and audio portions of the content can be communicated to the optional audio embedding module 170 for converting to text and embedding into the common embedding space as described below. In addition and in accordance with the present principles, user information, including user identification information and information regarding a user(s) association with multimodal content can be communicated to the user embedding module 140 for embedding into the common embedding space as described below.

As further depicted in FIG. 1, alternatively or in addition, in some embodiments in accordance with the present principles, the respective portions of the multimodal content, such as the text portions, the image portions, the audio portions and information regarding user association with the multimodal content, can be communicated to the respective modules, such as the text embedding module 120, the image embedding module 130, the optional audio embedding module 170, and the user embedding module 140, directly from a computing device, such as the computing device 1000 of FIG. 1 (described in greater detail below).

As depicted in FIG. 1, embodiments of a user content preference system in accordance with the present principles, such as the user content preference system 100 of FIG. 1, can be implemented in a computing device 1000 (described in greater detail with respect to FIG. 10) in accordance with the present principles. That is, in some embodiments, text, images, audio and video can be accessed by a user using the computing device 1000 from, for example, a social media site, e-books, electronic magazines, web pages, digital files and the like. In addition, text, images, audio and video that can be used to train an embedding space in accordance with the present principles and search queries to be processed can be accessed by the user content preference system 100 from the computing device 1000 using any input/output means associated with the computing device 1000. Results of the user content preference system in accordance with the present principles can be presented to a user using an output device of the computing device 1000, such as a display, a printer or any other form of output device (described in greater detail with respect to FIG. 10).

Referring back to the user content preference system 100 FIG. 1, in accordance with the present principles the user embedding module 140 embeds a representation of a user(s) associated with the content into the same, common embedding space. (inventors please briefly describe how a representation of a user is embedded into the embedding space). For example, in some embodiments in accordance with the present principles, once the embedding vectors of the images and text (and in some embodiments audio) are obtained for each user, the embedding vector for the respective user is obtained as the arithmetic average of the image and text embedding vectors.

In some embodiments, a common embedding space in accordance with the present principles can be pre-trained using Word2vec. Word2vec is a machine learning process/model that produces word embedding vectors, where words are associated with a number to produce a numerical essence of the word. In some embodiments, respective word vectors for the words representative of text interacted with by a user(s) can be created. Word2vec produces word embeddings (arrays of numbers) where the words (i.e., representative of text) with similar meanings or context are physically close to each other in the embedded space. The numbers are typically arranged in arrays that allow mathematical processes to be performed on the numbers. Quantifying words as a series of numbers allows machine learning to find a new word similar to the other two words based on numbers and data properties of each word based on a model. The words can then be graphed and compared to words based on mathematical properties. The distance between graphed words can be described as vectors or a distance with a direction. Moving from one graphed word to another graphed word in space allows one to represent/graph the idea of word relationships which are hard coded "word vectors." In such embodiments, a convolutional neural network (CNN) can be used to pre-train the embedding space.

Similarly, in some embodiments in accordance with the present principles the common embedding space can be pre-trained using an embedding model referred to as DeViSE (see, A. Frome, G. Corrado, and J. Shlens, "DeViSE: A deep visual-semantic embedding model," Adv. Neural . . . , pp. 1-11, 2013). Specifically, an image embedding is trained that maps every image to a word embedding space. This can be achieved using a convolutional neural network attaching a fully connected layer to transform. To avoid a sparse sampling of the embedding space during pre-training, additional data from external sources can be implemented to train the semantic embedding space to produce a dense object class sampling in the semantic embedding space. For example, in some embodiments, datasets such as the Microsoft common objects in context (COCO) dataset, which consists of multiple captions for each image, can be used. In some embodiments, the word embeddings are not learned but are initialized using GloVE (see, J. Pennington, R. Socher, and C. D. Manning, "GloVe: Global Vectors for Word Representation.").

Figure 2:
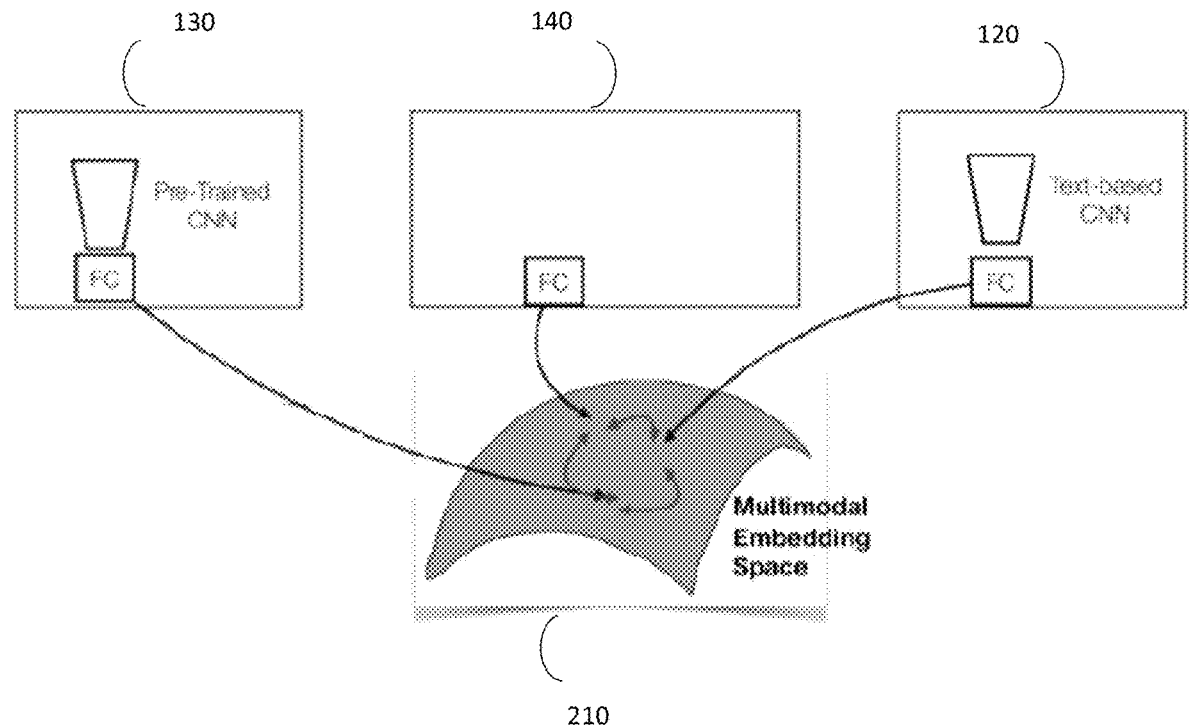
FIG. 2 depicts a functional block diagram of an embodiment of the training of a common embedding space by a user content preference system in accordance with the present principles.

To more specifically train an embedding space in accordance with the present principles, content associated with respective users is used to train a common embedding space. FIG. 2 depicts a functional block diagram of an embodiment of the training of a common embedding space by a user content preference system in accordance with the present principles, such as the user content preference system 100 FIG. 1. As depicted in FIG. 2, the text embedding module 120 embeds text separated from content associated with the user(s) into an embedding space 210 and the image embedding module 130 embeds images separated from content associated with the user(s) into the same embedding space 210.

In some embodiments, the text embedding module 120 determines respective vector representations of the text separated from content associated with the user(s) for embedding the text into the common embedding space 210. Similarly, in some embodiments, the image embedding module 130 determines respective vector representations of the images separated from content associated with the user(s) for embedding the images into the common embedding space 210. That is, the text received by the text embedding module 120 and the images received by the image embedding module 130 can be embedded in the pre-trained embedding space 210 by, in some embodiments, embedding word vectors representative of the text and features of the images into the embedding space 210 via, for example, a linear projection. As depicted in FIG. 2, in some embodiments in accordance with the present principles, the image embedding module 130 can include a deep image encoder 220 implementing a convolutional neural network (CNN) with fully connected (FC) layers to process the images for embedding. As further depicted in FIG. 2, in some embodiments in accordance with the present principles, the text embedding module 120 can include a deep text encoder 230 implementing a text-based convolutional neural network (CNN) with fully connected (FC) layers to process the text for embedding. In accordance with embodiments of the present principles, the phrase fully connected is intended to describe paired relationships including, such as, content-content and content-user pairs.

As described above and in accordance with the present principles, a representation of the user(s) associated with the text and the images embedded into the embedding space is also embedded into the same embedding space 210 by the user embedding module 140. That is, in some embodiments in accordance with the present principles, each user is modeled and embedded into the embedding space 210 using an embedding vector determined from an analysis of the respective content associated with each user(s). For example, in some embodiments in accordance with the present principles and as described above, once the embedding vectors of the text and images (and in some embodiments audio) associated with a respective user are obtained, the embedding vector for the respective user is obtained as the arithmetic average of the respective text and image embedding vectors.

As such, in some embodiments in accordance with the present principles, for each of a plurality of modalities of the multimodal content received by a user content preference system, a respective modality vector representative of the various modalities of the content of the multimodal content is created as described above. For example, in some embodiments for each of a plurality of words/text of the multimodal content received by the user content preference system 100 of FIG. 1, a respective, first modality vector representation of word/text content of the multimodal content can be created by the text embedding module 120 for embedding into a common embedding space. In addition, for each of a plurality of images of the multimodal content received by the user content preference system 100 of FIG. 1, a respective, second modality feature vector representation of image content of the multimodal content can be created by the image embedding module 130 for embedding into the common embedding space. In accordance with the present principles, a user content preference system in accordance with the present principles is capable of creating vector representations for any plurality of modalities of content, such as audio, and for content attributes, such as whether content was 'liked' by a user(s), 'disliked' by a user(s), 'posted' by a user(s), and/or 're-posted' by a user(s). For example, in some embodiments, for each of a plurality of audio content of the multimodal content received by the user content preference system 100 of FIG. 1, a respective modality vector representation of audio content of the multimodal content can be created by the image audio embedding module 170 for embedding into the common embedding space.

Furthermore and as described above, once the embedding vectors of the text and images (and in some embodiments audio) associated with a particular user are obtained, a representation user can be embedded in the common embedding space by, in some embodiments, determining an embedding vector for the respective user using information associated with the respective text and image embedding vectors.

In accordance with embodiments of the present principles, the vector representations of the different modalities of the user(s)-consumed content and the user(s) are embedded into the common embedding space 210 using a mixture of loss functions for the multimodal content that pushes closer co-occurring pairs of multimodal content (image-text pairs, text-user pairs, and image-user pairs). That is, in some embodiments in accordance with the present principles, multimodal content can be embedded in the common embedding space 210 according to equation one (1), which follows:

$$\mathcal{L} = \frac{\lambda_1}{N_{T-U}} \mathcal{L}_{T-U} + \frac{\lambda_2}{N_{I-T}} \mathcal{L}_{I-T} + \frac{(1 - \lambda_1 - \lambda_2)}{N_{I-U}} \mathcal{L}_{I-U}. \quad (1)$$

$$\text{s.t. } \lambda_1, \lambda_2 \le 1$$

In equation one (1), each ranking loss is a ranking loss that pushes closer co-occurring pairs of multimodal content. That is, in equation one (1), lambdas control the relative contribution of each of the modality pairs. Equation one (1) comprises a mixture of loss functions that can be computed for each pair of modalities (i.e., image-text pairs, text-user pairs, and image-user pairs). Although the combined loss function in accordance with the present principles is described above as a mixture of loss functions computed for three (3) pairs of modalities (e.g., image-text pairs, text-user pairs, and image-user pairs), in alternated embodiments, a combined loss function in accordance with the present principles can be computed for any number of pairs of modalities to be embedded in a common embedding space of the present principles.

Figure 3:
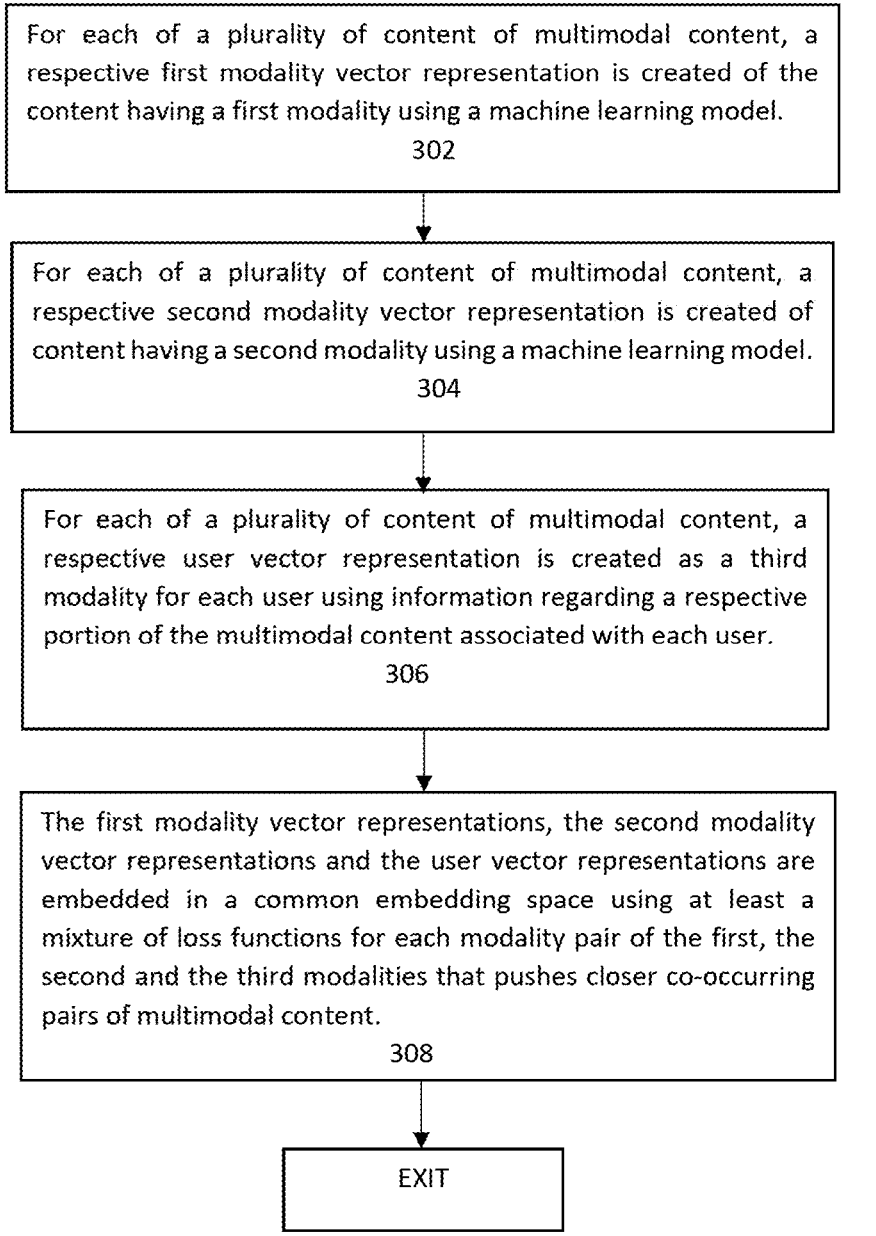
FIG. 3 depicts a flow diagram of a method for creating a common embedding space for multimodal content for determining user interests in accordance with an embodiment of the present principles.

FIG. 3 depicts a flow diagram of a method 300 for creating a common embedding space for multimodal content for determining user interests in accordance with an embodiment of the present principles. The method 300 begins at 302 during which, for each of a plurality of content of the multimodal content, a respective first modality vector representation is created of the content of the multimodal content having a first modality (e.g., text) using a machine learning model. The method proceeds to 304.

At 304, for each of a plurality of content of the multimodal content, a respective second modality vector representation is created of content of the multimodal content having a second modality (e.g., image) using a machine learning model. The method proceeds to 306.

At 306, for each of a plurality of content of the multimodal content, a respective user vector representation is created as a third modality for each user associated with at least a portion of the multimodal content using information regarding a respective portion of the multimodal content associated with each user. The method proceeds to 308.

At 308, the first modality vector representations, the second modality vector representations and the user vector representations are embedded in a common embedding space using at least a mixture of loss functions for each modality pair of the first, the second and the third modalities that pushes closer co-occurring pairs of multimodal content. In accordance with the present principles, embedded modality vectors that are related, across modalities, are closer together in the common embedding space than unrelated modality vectors.

The method 300 can then be exited.

Once the common embedding space 210 is created as described above, users and multimodal content associated with the users can be evaluated using the created common embedding space. For example, in some embodiments for content understanding, given an image, the image can be projected into the common embedding space and the closest images to the projected image in the common embedding space can be retrieved and evaluated to provide understanding of the image projected into the common embedding space. In some embodiments for discovering user interests, given content, the content can be projected into the common embedding space and the closest user to the content projected into the common embedding space can be retrieved to determine a most likely user associated with (i.e., that posted) the content.

In some embodiments, for multimodal content such as text, images and user(s) representations projected into the common embedding space, a similarity between the projected text, images and user(s) representations and the embedded modalities can be determined by, for example, the matching module 150 of the content preference system 100 of FIG. 1 using a distance function, such as at least one of a cosine function, a Euclidean function and/or a Lagrangian point 1, L1, function, and the like. For example, in some embodiments in accordance with the present principles, a similarity can be computed using cosine similarity according to equations two (2) and three (3), which follow:

$$S(x_j^T, x_n^U) = \frac{x_j^T x_n^U}{\|x_j^T\|_2 \|x_n^U\|_2} \quad (2)$$

$$\mathcal{L}_{U-T}(T_j U_j) = \sum_{U_n \in \mathbb{U}} \left[0, m - S(x_j^T x_j^U) + S(x_j^T x_n^U)\right]_+ \quad (3)$$

Embodiments in accordance with the present principles enable associating a user with embedded content in a mathematical manner to enable pairing a user with multimodal content and the like. More specifically, embodiments of the present principles are capable of cross-modal retrieval such as content understanding, a discovery of user interests and a prediction of user interest as described above. More specifically and referring to the user content preference system 100 of FIG. 1 and to FIG. 2, once an embedding space 210 has been pre-trained and consumed user content has been embedded into the common embedding space 210 to create the embedding space 210 as described above, for content understanding, given an image from for example the searchable storage 160, the matching module 150 can project the subject image into the common embedding space 210 and the matching module 150 can retrieve the closest images in the common embedding space 210.

In some embodiments, for discovering user interests, given an image/content from for example the searchable storage 160, the matching module 150 can project the subject image into the common embedding space 210 and the matching module 150 can retrieve information regarding a closest embedded user in the common embedding space 210 to determine a most likely user that posted/commented on the image/content (i.e., Image-To-User, Text-To-User).

In some embodiments, for discovering user interests, given a subject user, the matching module 150 can project the user into the common embedding space 210, if the user does not already exists in the common embedding space, and the matching module 150 can retrieve information regarding closest embedded content to the projected user in the common embedding space 210 to classify user interests (i.e., User-To-Image, User-To-Text).

In one experiment, real-world datasets were collected from Twitter and Instagram. In the Twitter environment, the inventors collected social media related data based on 100 popular hashtags, for example #love, #beautiful, #me, #cute, #nature, #amazing etc. The collected dataset contained content and users interested in diverse topics such as nature, art, international events, fashion, sports, movies, etc. This dataset was used to evaluate a cross-modal retrieval task. In the experiment the training set (multimodal embedding) included 7.10 million tweets and 981 thousand images. The testing set (cross-modal retrieval) included 1.89 million user-text pairs, 5 thousand image-text pairs, and 251 thousand image-user pairs. The ratio of image-text in the datasets was 1 to 9.

In the Instagram environment, a fashion Instagram dataset included an initial list of 23 brands strongly focused on shoes, fashion, and hospitality. Additional data was crawled from users who commented on the posts. A list of users was expanded by identifying users who followed these brands but were not included in the initial list. User interest was defined as either of 3 categories based on if a user presented, followed, or commented on one of the brands. This dataset was used for evaluating the task of predicting user interests. In the experiment, the fashion dataset included a total of 796 thousand posts, 796 thousand images, 722 thousand captions, and 2.9 thousand users. There were 739 users interested in shoes, 881 users interested in fashion, and 1.758 thousand users interested in hospitality. The ratio of image-text in the datasets was substantially 1 to 1.

FIG. 4 depicts a Table 400 of cross-modal retrieval results in the experiment for the Twitter and Instagram datasets for combinations of different modalities used for training a common embedding space. In the Table 400 of FIG. 4, the metric includes a mean-median rank of the ground-truth in which a best performance is equal to 1. As depicted in the Table 400 of FIG. 4, when an embedding space has been trained with a single modality pair (i.e., a single regularization parameter, either $\lambda_1$, $\lambda_2$, $\lambda_3$), the methodology works well for the trained modality pairs but does not perform well for other pairs. For example, as depicted in FIG. 4 in the rows under the heading "Single Modality Pair", when the methodology is trained using Text-User modality pairs, the methodology returns good results only for cross-modal retrieval of Text to User. Similarly, when the methodology is trained using Image-Text and Image-User modality pairs, the methodology returns good results only for cross-modal retrieval of Image to Text and Image to User data, respectively.

As depicted in the Table 400 of FIG. 4, when an embedding space has been trained with two modality pairs, the methodology works well for the trained, two modality pairs but does not perform well for other pairs. For example, in FIG. 4 in the rows under the heading "Two Modality Pairs" when the methodology is trained using two modality pairs, the methodology returns best results for cross-modal retrieval for those two modality pairs.

As depicted in the Table 400 of FIG. 4, however, it should be noted that, in accordance with the present principles, the methodology performs best when an embedding space has been trained with at least three modality pairs in accordance with embodiments of the present principles. That is, as depicted in FIG. 4, cross modal retrieval functions the best when an embedding space has been trained using at least three modality pairs in accordance with embodiments of the present principles.

From at least the data provided in the Table 400 of FIG. 4, it can be determined that in some embodiments in accordance with the present principles, embedding users into a common embedding space in accordance with the present principles enables the users to function as anchor points (topics) and regularizes the learning of Image-To-Text correlations resulting in performance improvements. For example, the data in FIG. 4 signify the mean average rank of the retrieval. The ideal result would return of value of one (1) (i.e., the top retrieval is always exactly what you want it to be). That is, in the embodiment of FIG. 4, the lower the average rank the better.

In an experiment to determine an ability of the methodology and system of embodiments of the present principles to predict user interests associated with the Instagram dataset, the inventors implemented a Linear-SVM classifier with C=1 across all features having 5-fold cross-validation to determine an F1 score (harmonic mean of precision and recall). It should be noted that an F-score or F-measure is a measure of a test's accuracy. It is calculated from the precision and recall of the test, where the precision is the number of correctly identified positive results dividend by the number of all positive results, including those not identified correctly, and the recall is the number of correctly identified positive results divided by the number of all samples that should have been identified as positive.

In the experiment, the inventors utilized the learned user embeddings to predict user interests on the Instagram dataset. FIG. 5 depicts a Table 500 of comparisons of resulting F1 scores of a Naïve Baseline, which averages the text (e.g., word2vec) or image embeddings from a user to obtain the characteristic embeddings (Avg-Text/Avg-Image) versus resulting F1 scores of single modality pair embeddings and versus resulting F1 scores of a combination of at least three modality pair embeddings in accordance with embodiments of the present principles. As depicted in the Table 500 of FIG. 5, for the Baseline methodology, the Avg-Text had an F1 score of 0.40 and the Avg-Image had an F1 score of 0.45. As further depicted in the Table 500 of FIG. 5, for the single-modality pairs, the Text-User pair had an F1 score of 0.47 and the Image-User pair had an F1 score of 0.49. Finally, as depicted in the Table 500 of FIG. 5, embedding at least three modality pairs in accordance with embodiments of the present principles results in a best F1 score of 0.52. The results depicted in the Table 500 of FIG. 5 highlight the ability of embodiments of the present principles to implicitly capture user behavior from content associated with the user.

In some embodiments, the learned user embeddings are clustered using k-means (K=50). The cluster embeddings lie in a same space in the common embedding space. The top images (image similarity) and the top words (collective words of all the users—common words) of a cluster/space can be displayed to present on, for example, a display device of the computing device 500, a representation of the images and associated words for various discovered clusters to visually represent determined user interests. In some embodiments, a number of top images is an arbitrary choice based on experience and on the size of a retrieval space.

Figure 6:
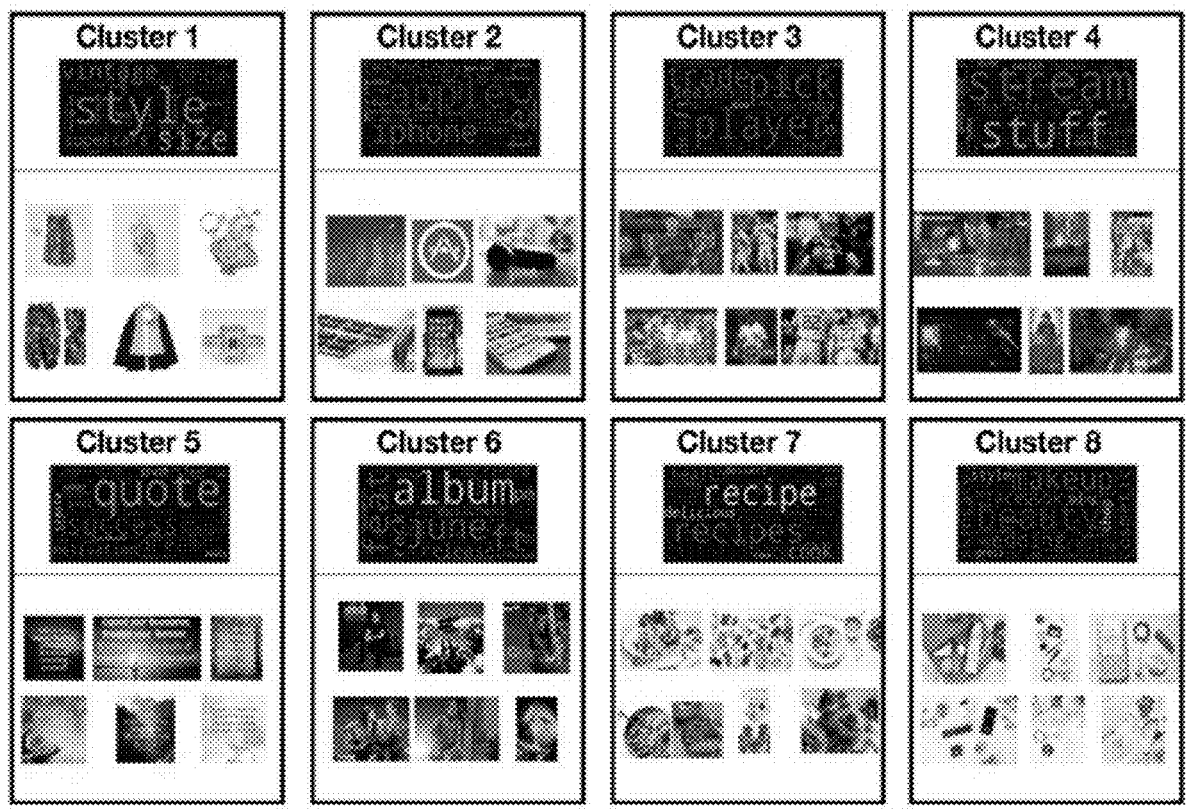
FIG. 6 depicts an example of the visual display of top images and top words of eight (8) clusters of images and words clustered in accordance with embodiments of the present principles.

FIG. 6 depicts an example of the visual display of top images and top words of eight (8) clusters of images and words clustered in accordance with embodiments of the present principles. For example, Cluster 1 of FIG. 6 depicts words including 'style', 'size' and 'vintage' and images of clothing and jewelry; Cluster 2 depicts words including 'apple', 'iphone' and 'tech' and images of iphones, computers and headphones; Cluster 3 depicts words including 'player', 'trade' and 'pick' and images of baseball players and football players; Cluster 4 depicts words including 'stream', 'character' and 'stuff' and images of video game characters and anime characters; Cluster 5 depicts words including 'quote', 'success' and 'dreams' and images of various motivational quotes and pictures; Cluster 6 depicts words including 'album', 'june', and 'rock' and images of rock albums and artist performances associated with the month of June; Cluster 7 depicts words including 'recipe', 'health, and 'cook' and images of healthy foods and meals; and Cluster 8 depicts words including 'makeup', 'beauty' and 'style' and images of various forms of makeup and stylish accessories.

Figure 7:
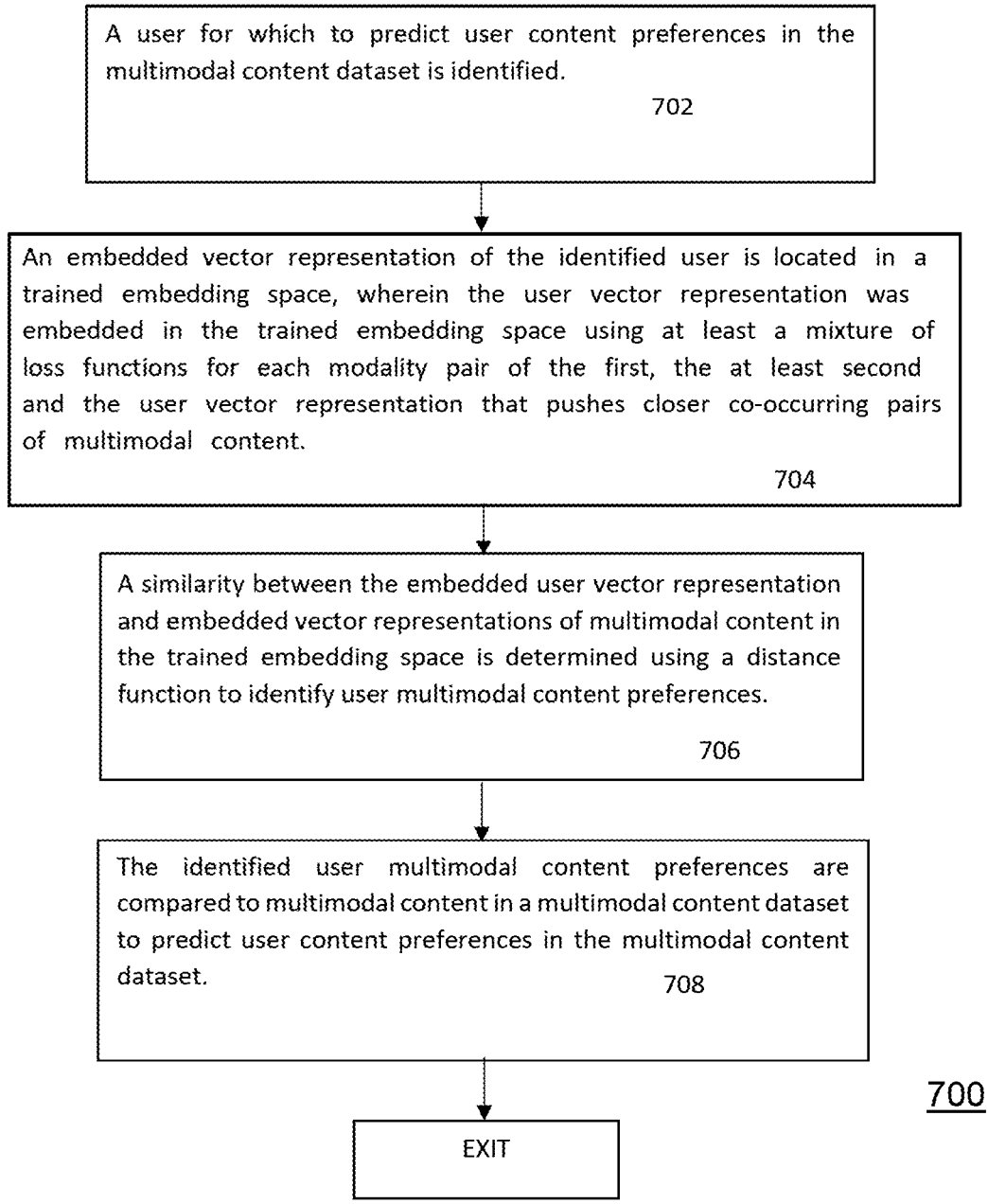
FIG. 7 depicts a flow diagram of a method for predicting user content preferences in a multimodal content dataset using a trained embedding space having embedded therein a plurality of user vector representations in accordance with an embodiment of the present principles.

FIG. 7 depicts a flow diagram of a method 700 for predicting user content preferences in a multimodal content dataset using a trained embedding space having embedded therein a plurality of user vector representations in accordance with an embodiment of the present principles. The method 700 begins at 702 during which a user for which to predict user content preferences in the multimodal content dataset is identified. The method 700 can proceed to 704.

At 704, an embedded vector representation of the identified user is located in the trained embedding space. In the embodiment of FIG. 7, the user vector representation is embedded in the trained embedding space using at least a mixture of loss functions for each modality pair of the first, the at least second and the user vector representation that pushes closer co-occurring pairs of multimodal content The method 700 can proceed to 706.

At 706, a similarity between the embedded user vector representation and embedded vector representations of multimodal content in the trained embedding space is determined using a distance function to identify user multimodal content preferences. The method can proceed to 708.

At 708, the identified user multimodal content preferences are compared to multimodal content in the multimodal content dataset to predict user content preferences in the multimodal content dataset. The method 700 can be exited.

Figure 8A:
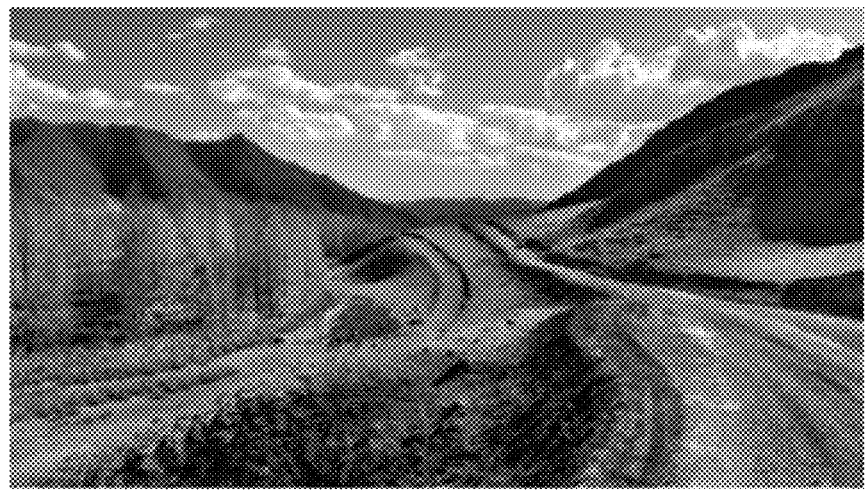
FIG. 8A depicts an image of a mountainous scene that has been determined to be content preferred by a user in accordance with embodiments of the present principles.
Figure 8B:
FIG. 8B depicts an image of pollution being created by factories in an industrial setting.

Referring back to the user content preference system 100 of FIG. 1, in some embodiments, once user content preferences have been determined and predicted as described above, preferred user content can be altered by the user content preference system 100 to convey the intent of a message to a user using user preferred content. For example, FIG. 8A depicts an image of a mountainous scene that has been determined to be content preferred by a user in accordance with embodiments of the present principles. FIG. 8B depicts an image of pollution being created by factories in an industrial setting. In some embodiments in accordance with the present principles, the discriminator 154 of the matching module 150 can be trained to determine intent from content (e.g., text, image, audio, etc.). For example, in some embodiments, a semantic embedding space can be trained using a plurality of text and images (and audio, etc.) having known associated message intents. Vector representations of the text/images and respective intents of the text/images are embedded in the semantic embedding space such that related content and intents are closer in the embedding space than unrelated content and intents. As such and in accordance with embodiments of the present principles, the discriminator 154 of the matching module 150 can project a feature vector representation of the image of FIG. 8B into the trained semantic embedding space to determine an intent intended to be conveyed to a user by the image of FIG. 8B and features that comprise that intent. As depicted in FIG. 8B, the intent of the image is to convey the idea of pollution to a user.

Figure 8C:
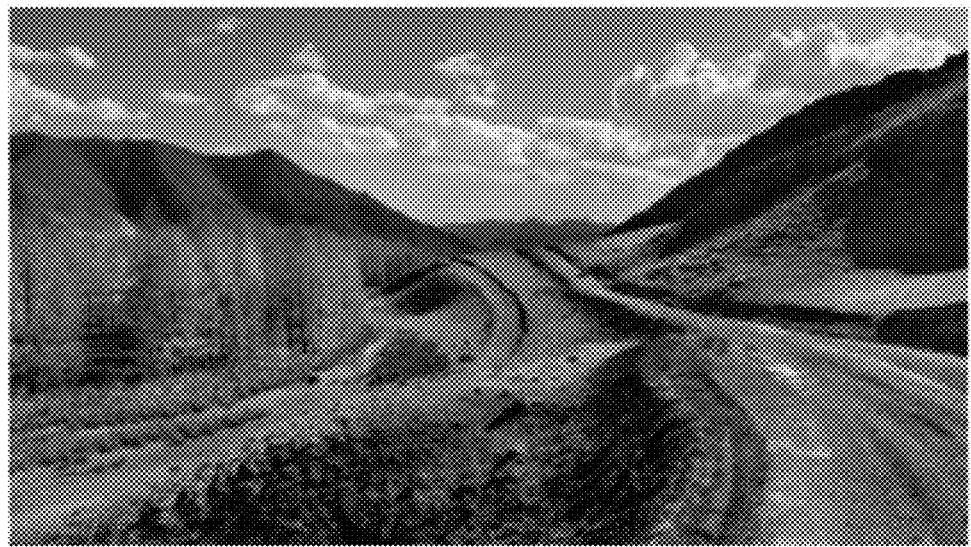
FIG. 8C depicts an image combining the determined user preferred content of FIG. 8A and the features of the intent intended to be conveyed to the user of FIG. 8B in accordance with an embodiment of the present principles.

In the matching module 150 of the content preference system 100 of FIG. 1, the generator 152 is implemented to alter the determined user preferred content, for example depicted in FIG. 8A, to convey the intent intended to be conveyed to the user, for example depicted in FIG. 8B. FIG. 8C depicts an image combining the determined user preferred content of, for example, FIG. 8A and the features of the intent intended to be conveyed to the user of, for example, FIG. 8B. For example, the image depicted in FIG. 8C, which in embodiments is generated by the generator 152 of the matching module 150, comprises a mountainous scene, similar to FIG. 8A, with features that convey the notion of pollution, similar to FIG. 8B.

In some embodiments, the generator 152 and the discriminator 154 of the matching module 150 comprise an adversarial relationship. More specifically, in some embodiments altered images, having known intended intents to be conveyed, created by the generator 152 are reviewed by the discriminator 154, which determines if the generator 152 has created an image that conveys the intended intent. The back and forth between the creation of an image by the generator 152 and the review of the image by the discriminator 154 continues until the created image is acceptable to the discriminator 154 as conveying the intended intent.

Alternatively or in addition, in some embodiments the discriminator 154 also discriminates whether an image created by the generator 152 reflects the determined user preferred content. More specifically, in some embodiments altered images, having user preferred content created by the generator 152 are reviewed by the discriminator 154, which determines if the generator 152 has created an image that reflects the features of the determined user preferred content. The back and forth between the creation of user preferred content by the generator 152 and the review of the content by the discriminator 154 continues until the created image is acceptable to the discriminator 154 as conveying the intended intent.

In such embodiments, a semantic embedding space can be trained using a plurality of text and images (and audio, etc.) having known categories. Vector representations of the text/images and respective categories of the text/images are embedded in the semantic embedding space such that related text/images and categories of the content that are closer in the embedding space than unrelated text/images and categories. Using the embedding space, the generator 152 is able to determine features of categories of text and images. Knowing features of the categories of text and images, the discriminator 154 is able to determine if content created by the generator 152, which is intended to reflect the user preferred content, is accurate. The back and forth between the creation of user preferred content by the generator 152 and the review of the content by the discriminator 154 continues until the created user preferred content is acceptable to the discriminator 154 as being reflective of the original user preferred content.

Although the embodiment of the present principles described with reference to FIGS. 8A, 8B, and 8C is described with respect to a user preferred image, in alternate embodiments, the same methodology of the present principles can be applied to other user preferred content including text, audio and the like. For example, in one audio embodiment determined user preferred content can include audio content spoken in a user preferred English accent. Using a predefined semantic embedding space as described above, the generator 152 can determine features of the determined user preferred audio content that define the determined user preferred audio content as comprising an English accent. A second audio content can include a message/intent desired to be conveyed using the determined user preferred content type (e.g., English accent). For example, the second audio content can include a message/intent in an Irish accent conveying a message that music is therapeutic. In such an embodiment, the discriminator 154 can determine the intent of the second audio content using a predetermined semantic embedding space as described above.

Knowing the desired intent of the second audio content (i.e., that music is therapeutic), the generator 152 generates audio content conveying the message that music is therapeutic (message/intent) in an English accent (the determined user preferred content type).

Figure 9:
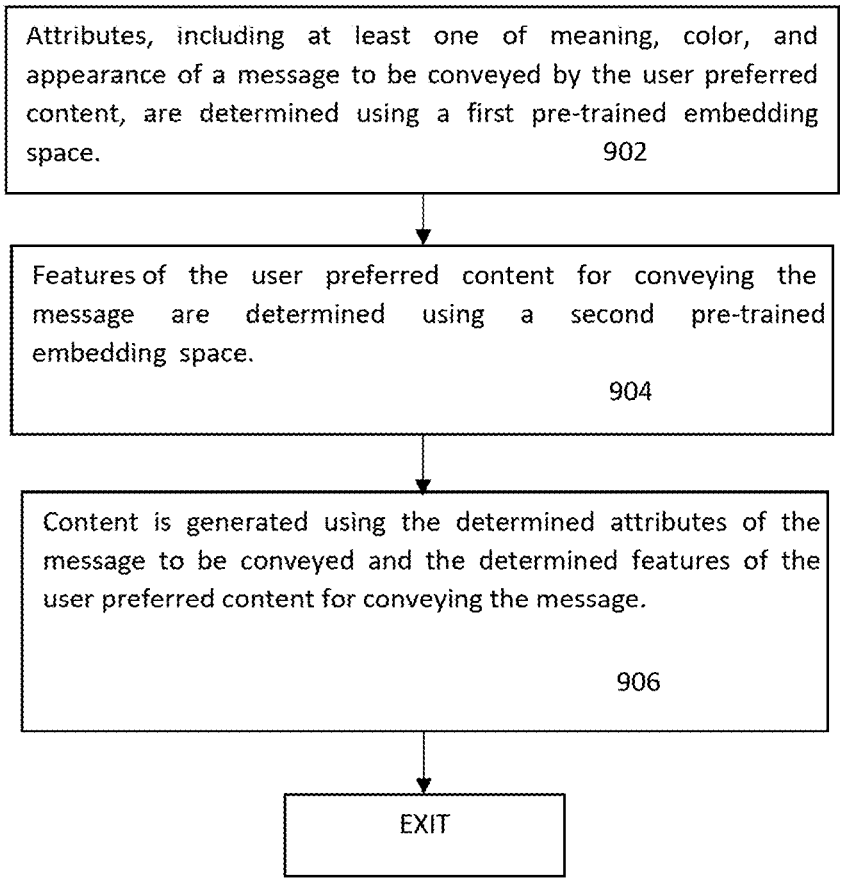
FIG. 9 depicts a flow diagram of a method for using determined user preferred content for conveying message intents in accordance with an embodiment of the present principles.

FIG. 9 depicts a flow diagram of a method 900 for using determined user preferred content for conveying message intents in accordance with an embodiment of the present principles. The method 900 begins at 902 during which attributes, including at least one of meaning, color, and appearance of a message to be conveyed by the user preferred content, are determined using a first pre-trained embedding space. The method 900 can proceed to 904.

At 904, features of the user preferred content for conveying the message are determined using a second pre-trained embedding space. The method 900 can proceed to 906.

At 906, content is generated using the determined attributes of the message to be conveyed and the determined features of the user preferred content for conveying the message. The method 900 can be exited.

Figure 10:
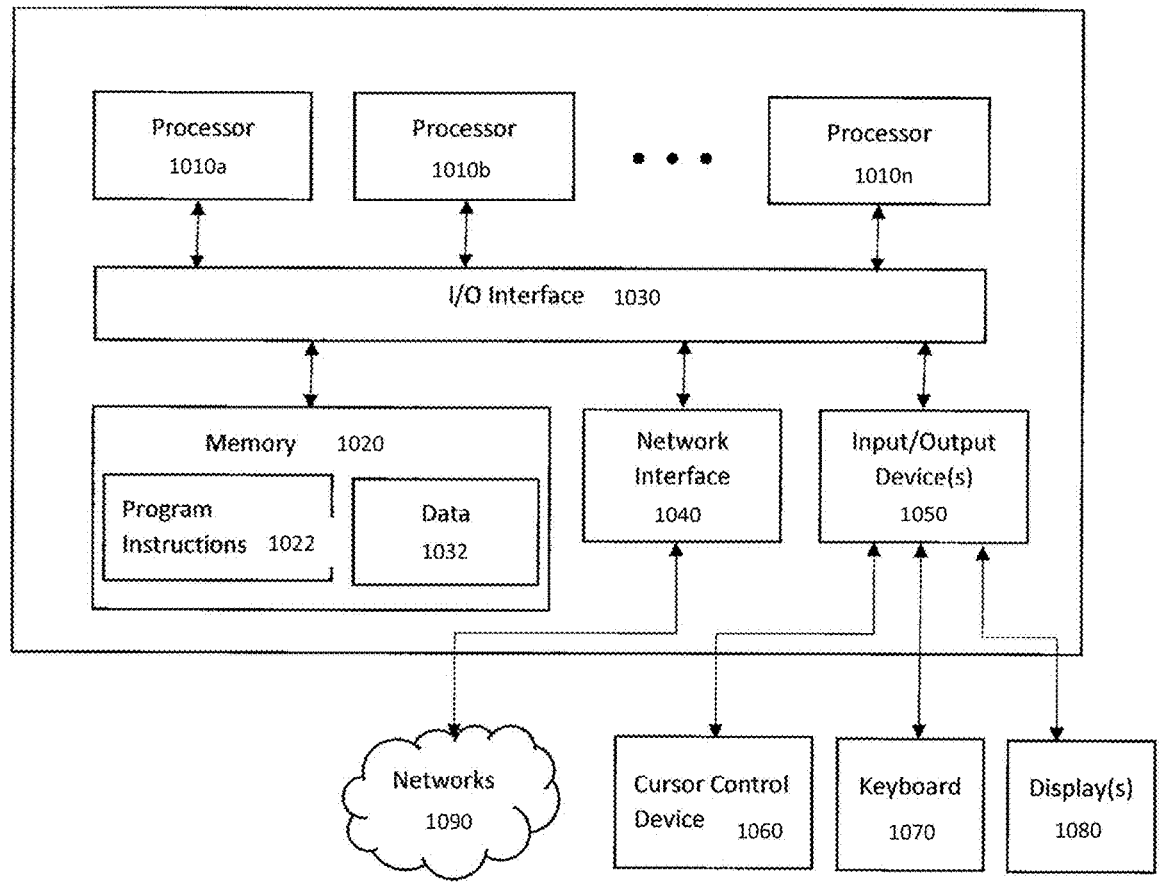
FIG. 10 depicts a high-level block diagram of a computing device suitable for use with embodiments of a user content preference system in accordance with the present principles.

FIG. 10 depicts a high-level block diagram of a computing device 1000 suitable for use with embodiments of a user content preference system in accordance with the present principles such as the user content preference system 100 of FIG. 1. In some embodiments, the computing device 1000 can be configured to implement methods of the present principles, such as at least the method 300 of FIG. 3, the method 700 of FIG. 7 and the method 900 of FIG. 9, as processor-executable executable program instructions 1022 (e.g., program instructions executable by processor(s) 1010) in various embodiments.

In the embodiment of FIG. 10, the computing device 1000 includes one or more processors 1010a-1010n coupled to a system memory 1020 via an input/output (I/O) interface 1030. The computing device 1000 further includes a network interface 1040 coupled to I/O interface 1030, and one or more input/output devices 1050, such as cursor control device 1060, keyboard 1070, and display(s) 1080. In various embodiments, a user interface can be generated and displayed on display 1080. In some cases, it is contemplated that embodiments can be implemented using a single instance of computing device 1000, while in other embodiments multiple such systems, or multiple nodes making up the computing device 1000, can be configured to host different portions or instances of various embodiments. For example, in one embodiment some elements can be implemented via one or more nodes of the computing device 1000 that are distinct from those nodes implementing other elements. In another example, multiple nodes may implement the computing device 1000 in a distributed manner.

In different embodiments, the computing device 1000 can be any of various types of devices, including, but not limited to, a personal computer system, desktop computer, laptop, notebook, tablet or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In various embodiments, the computing device 1000 can be a uniprocessor system including one processor 1010, or a multiprocessor system including several processors 1010 (e.g., two, four, eight, or another suitable number). Processors 1010 can be any suitable processor capable of executing instructions. For example, in various embodiments processors 1010 may be general-purpose or embedded processors implementing any of a variety of instruction set architectures (ISAs). In multiprocessor systems, each of processors 1010 may commonly, but not necessarily, implement the same ISA.

System memory 1020 can be configured to store program instructions 1022 and/or data 1032 accessible by processor 1010. In various embodiments, system memory 1020 can be implemented using any suitable memory technology, such as static random-access memory (SRAM), synchronous dynamic RAM (SDRAM), nonvolatile/Flash-type memory, or any other type of memory. In the illustrated embodiment, program instructions and data implementing any of the elements of the embodiments described above can be stored within system memory 1020. In other embodiments, program instructions and/or data can be received, sent or stored upon different types of computer-accessible media or on similar media separate from system memory 1020 or computing device 1000.

In one embodiment, I/O interface 1030 can be configured to coordinate I/O traffic between processor 1010, system memory 1020, and any peripheral devices in the device, including network interface 1040 or other peripheral interfaces, such as input/output devices 1050. In some embodiments, I/O interface 1030 can perform any necessary protocol, timing or other data transformations to convert data signals from one component (e.g., system memory 1020) into a format suitable for use by another component (e.g., processor 1010). In some embodiments, I/O interface 1030 can include support for devices attached through various types of peripheral buses, such as a variant of the Peripheral Component Interconnect (PCI) bus standard or the Universal Serial Bus (USB) standard, for example. In some embodiments, the function of I/O interface 1030 can be split into two or more separate components, such as a north bridge and a south bridge, for example. Also, in some embodiments some or all of the functionality of I/O interface 1030, such as an interface to system memory 1020, can be incorporated directly into processor 1010.

Network interface 1040 can be configured to allow data to be exchanged between the computing device 1000 and other devices attached to a network (e.g., network 1090), such as one or more external systems or between nodes of the computing device 1000. In various embodiments, network 1090 can include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 1040 can support communication via wired or wireless general data networks, such as any suitable type of Ethernet network, for example; via digital fiber communications networks; via storage area networks such as Fiber Channel SANs, or via any other suitable type of network and/or protocol.

Input/output devices 1050 can, in some embodiments, include one or more display terminals, keyboards, keypads, touchpads, scanning devices, voice or optical recognition devices, or any other devices suitable for entering or accessing data by one or more computer systems. Multiple input/output devices 1050 can be present in computer system or can be distributed on various nodes of the computing device 1000. In some embodiments, similar input/output devices can be separate from the computing device 1000 and can interact with one or more nodes of the computing device 1000 through a wired or wireless connection, such as over network interface 1040.

In some embodiments, the illustrated computing device 1000 can implement any of the operations and methods described above, such as the method 300 illustrated by the flowchart of FIG. 3, the method 700 illustrated by the flowchart of FIG. 7, and the method 900 illustrated by the flowchart of FIG. 9. In other embodiments, different elements and data can be included.

Those skilled in the art will appreciate that the computing device 1000 is merely illustrative and is not intended to limit the scope of embodiments. In particular, the computer system and devices can include any combination of hardware or software that can perform the indicated functions of various embodiments, including computers, network devices, Internet appliances, PDAs, wireless phones, pagers, and the like. The computing device 1000 can also be connected to other devices that are not illustrated, or instead can operate as a stand-alone system. In addition, the functionality provided by the illustrated components can in some embodiments be combined in fewer components or distributed in additional components. Similarly, in some embodiments, the functionality of some of the illustrated components may not be provided and/or other additional functionality can be available.

Those skilled in the art will also appreciate that, while various items are illustrated as being stored in memory or on storage while being used, these items or portions of them can be transferred between memory and other storage devices for purposes of memory management and data integrity. Alternatively, in other embodiments some or all of the software components can execute in memory on another device and communicate with the illustrated computer system via inter-computer communication. Some or all of the system components or data structures can also be stored (e.g., as instructions or structured data) on a computer-accessible medium or a portable article to be read by an appropriate drive, various examples of which are described above. In some embodiments, instructions stored on a computer-accessible medium separate from the computing device 1000 can be transmitted to the computing device 1000 via transmission media or signals such as electrical, electromagnetic, or digital signals, conveyed via a communication medium such as a network and/or a wireless link. Various embodiments can further include receiving, sending or storing instructions and/or data implemented in accordance with the foregoing description upon a computer-accessible medium or via a communication medium. In general, a computer-accessible medium can include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

Figure 11:
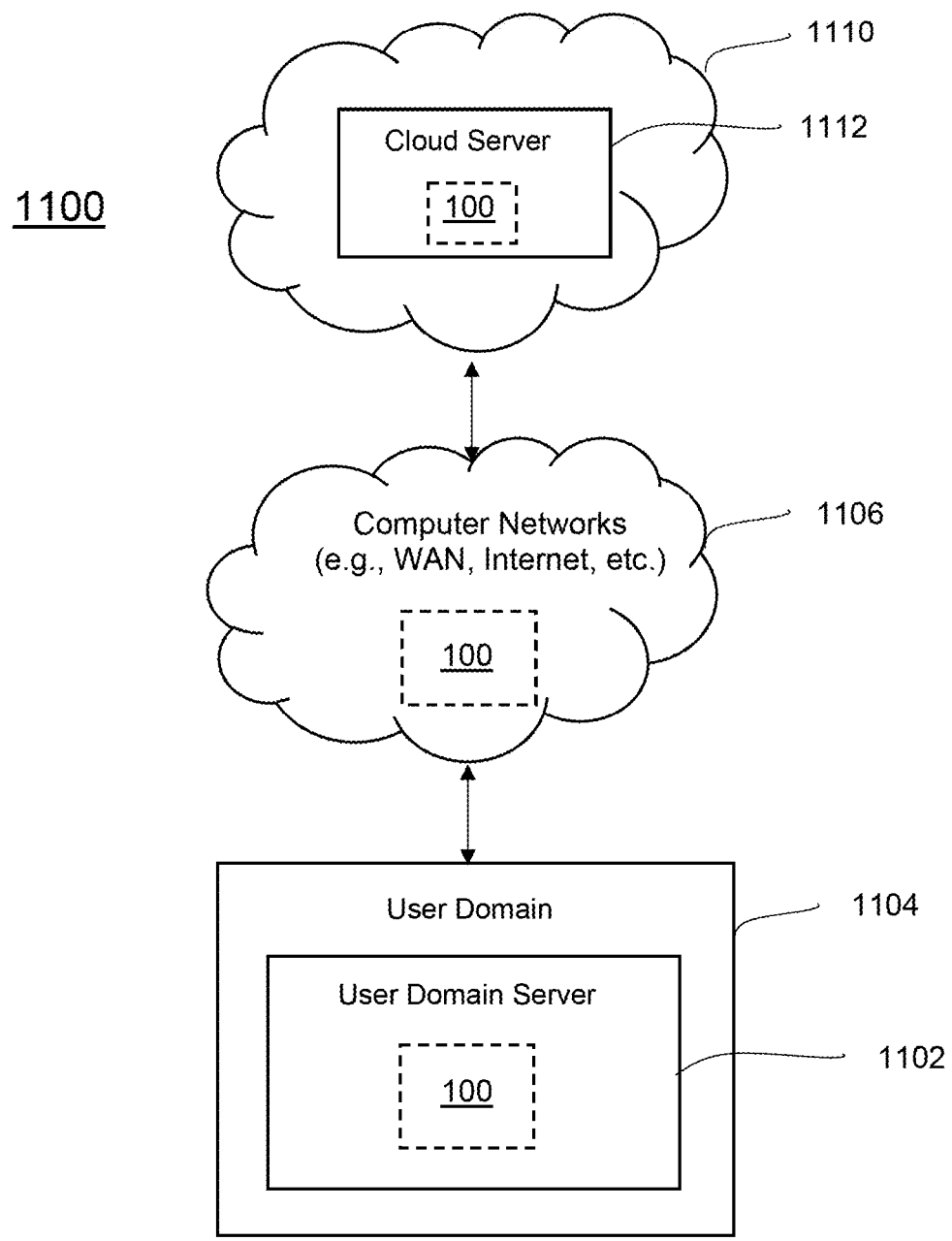
FIG. 11 depicts a high-level block diagram of a network in which embodiments of a user content preference system in accordance with the present principles can be implemented.

FIG. 11 depicts a high-level block diagram of a network in which embodiments of a user content preference system in accordance with the present principles can be implemented. The network environment 1100 of FIG. 11 illustratively comprises a user domain 1102 including a user domain server 1104. The network environment 1100 of FIG. 11 further comprises computer networks 1106, and a cloud environment 1110 including a cloud server 1112.

In the network environment 1100 of FIG. 11, a user content preference system in accordance with the present principles, such as the user content preference system 100 of FIG. 1, can be included in at least one of the user domain server 1104, the computer networks 1106 and the cloud server 1112. That is, in some embodiments, a user can use a local server (e.g., the user domain server 1104) to provide the functionality of a user content preference system in accordance with the present principles.

In some embodiments and as described above, a user can implement a user content preference system in the computer networks 1106 for determining and providing user-preferred content using multimodal embeddings in accordance with the present principles. Alternatively or in addition, in some embodiments, a user can implement a user content preference system in the cloud server 1112 of the cloud environment 1110 for determining and providing user-preferred content using multimodal embeddings in accordance with the present principles. For example, in some embodiments it can be advantageous to perform processing functions of the present principles in the cloud environment 1110 to take advantage of the processing capabilities of the cloud environment 1110. In some embodiments in accordance with the present principles, a user content preference system can be located in a single or in multiple locations/servers/computers to perform all or portions of the herein described functionalities of a user content preference system in accordance with the present principles.

Embodiments of the present principles can be implemented in many applications including: Law Enforcement and Defense, in which a content preference system of the present principles can help identify purveyors of anti US Government or terrorist recruitment content as well as a target vulnerable audience; Marketing, in which a content preference system of the present principles can be used in targeted advertising and to identify vendors of desired products; Entertainment, in which a content preference system of the present principles can enable matching of content providers with interested content consumers, and Social Media, in which a content preference system of the present principles can identify content influencers.

The methods and processes described herein may be implemented in software, hardware, or a combination thereof, in different embodiments. In addition, the order of methods can be changed, and various elements can be added, reordered, combined, omitted or otherwise modified. All examples described herein are presented in a non-limiting manner. Various modifications and changes can be made as would be obvious to a person skilled in the art having benefit of this disclosure. Realizations in accordance with embodiments have been described in the context of particular embodiments. These embodiments are meant to be illustrative and not limiting. Many variations, modifications, additions, and improvements are possible. Accordingly, plural instances can be provided for components described herein as a single instance. Boundaries between various components, operations and data stores are somewhat arbitrary, and particular operations are illustrated in the context of specific illustrative configurations. Other allocations of functionality are envisioned and can fall within the scope of claims that follow. Structures and functionality presented as discrete components in the example configurations can be implemented as a combined structure or component. These and other variations, modifications, additions, and improvements can fall within the scope of embodiments as defined in the claims that follow.

In the foregoing description, numerous specific details, examples, and scenarios are set forth in order to provide a more thorough understanding of the present disclosure. It will be appreciated, however, that embodiments of the disclosure can be practiced without such specific details. Further, such examples and scenarios are provided for illustration, and are not intended to limit the disclosure in any way. Those of ordinary skill in the art, with the included descriptions, should be able to implement appropriate functionality without undue experimentation.

References in the specification to "an embodiment," etc., indicate that the embodiment described can include a particular feature, structure, or characteristic, but every embodiment may not necessarily include the particular feature, structure, or characteristic. Such phrases are not necessarily referring to the same embodiment. Further, when a particular feature, structure, or characteristic is described in connection with an embodiment, it is believed to be within the knowledge of one skilled in the art to affect such feature, structure, or characteristic in connection with other embodiments whether or not explicitly indicated.

Embodiments in accordance with the disclosure can be implemented in hardware, firmware, software, or any combination thereof. Embodiments can also be implemented as instructions stored using one or more machine-readable media, which may be read and executed by one or more processors. A machine-readable medium can include any mechanism for storing or transmitting information in a form readable by a machine (e.g., a computing device or a "virtual machine" running on one or more computing devices). For example, a machine-readable medium can include any suitable form of volatile or non-volatile memory.

Modules, data structures, and the like defined herein are defined as such for ease of discussion and are not intended to imply that any specific implementation details are required. For example, any of the described modules and/or data structures can be combined or divided into sub-modules, sub-processes or other units of computer code or data as can be required by a particular design or implementation.

In the drawings, specific arrangements or orderings of schematic elements can be shown for ease of description. However, the specific ordering or arrangement of such elements is not meant to imply that a particular order or sequence of processing, or separation of processes, is required in all embodiments. In general, schematic elements used to represent instruction blocks or modules can be implemented using any suitable form of machine-readable instruction, and each such instruction can be implemented using any suitable programming language, library, application-programming interface (API), and/or other software development tools or frameworks. Similarly, schematic elements used to represent data or information can be implemented using any suitable electronic arrangement or data structure. Further, some connections, relationships or associations between elements can be simplified or not shown in the drawings so as not to obscure the disclosure.

This disclosure is to be considered as exemplary and not restrictive in character, and all changes and modifications that come within the guidelines of the disclosure are desired to be protected.

The invention claimed is:

1. A method for training a neural network for creating a common embedding space for multimodal content for determining user-content associations, comprising:
   for each of a plurality of content of the multimodal content, creating respective first modality vector representations of the content of the multimodal content having a first modality using a machine learning model;
   creating a first training set comprising the first modality vector representations;
   training the neural network in a first stage using the first training set by embedding the first modality vector representations in a common embedding space;
   for each of a plurality of content of the multimodal content, creating at least respective second modality vector representations of content of the multimodal content having at least a second modality using a machine learning model;
   creating a second training set comprising the second modality vector representations;
   training the neural network in a second stage using the second training set by embedding the second modality vector representations in the common embedding space;
   creating a respective user vector representation, as a third modality, for each user associated with at least a portion of the multimodal content using information regarding a respective portion of the multimodal content associated with each user;
   creating a third training set comprising the third modality vector representations; and
   training the neural network in a third stage using the third training set by embedding the third modality vector representations in the common embedding space;
   wherein the first modality vector representations, the at least second modality vector representations and the user vector representations are embedded in the common embedding space using at least a combined loss function which comprises a ranking loss component for each modality pair of the first, the at least second and the third modalities that pushes closer co-occurring pairs of multimodal content.

2. The method of claim 1, wherein at least three mixture loss functions are used to embed the first modality vector representations, the at least second modality vector representations and the user vector representations in the common embedding space.

3. The method of claim 1, wherein the first modality comprises text and the at least second modality comprises at least images.

4. The method of claim 3, wherein the machine learning model for creating the first modality vector representation comprises a text-based convolutional neural network (CNN) with fully connected (FC) layers and the machine learning model for creating the at least second modality vector representation comprises a deep image encoder implementing a convolutional neural network (CNN) with fully connected (FC) layers.

5. The method of claim 1, comprising:
   for each of a plurality of content of the multimodal content, creating at least a respective fourth modality vector representation of content of the multimodal content having at least a fourth modality using a machine learning model; and
   embedding the first modality vector representations, the at least second modality vector representations, the user vector representations and the at least fourth modality vector representation in a common embedding space using at least a mixture of loss functions for each modality pair of the first, the at least second, the third, and the fourth modalities that pushes closer co-occurring pairs of multimodal content.

6. The method of claim 5, wherein the at least fourth modality comprises audio and wherein at least four mixture loss functions are used to embed the first modality vector representations, the at least second modality vector representations, the user vector representations and the at least fourth modality vector representations in the common embedding space.

7. The method of claim 1, wherein the user vector representation of a user is created as an arithmetic average of respective first modality vector representations and respective at least second modality vector representations of multimodal content associated with the user.

8. The method of claim 1, further comprising:
   determining a similarity between the embedded user vector representation and the embedded first modality vector representations and the at least second modality vector representations using a distance function to identify user multimodal content preferences.

9. A method for predicting user content preferences of multimodal content in a multimodal content database using a trained embedding space having embedded therein a plurality of user vector representations and multimodal content including a first modality and at least a second modality, comprising:
   identifying a user for which to predict user content preferences of the multimodal content;
   locating an embedded user vector representation of the identified user in the trained embedding space, wherein the user vector representation was embedded in the trained embedding space using at least a combined loss function which comprises a ranking loss component for each modality pair of the first, the at least second and the user vector representation that pushes closer co-occurring pairs of multimodal content;
   determining a similarity between the embedded user vector representation and embedded vector representations of multimodal content in the trained embedding space using a distance function to identify user multimodal content preferences; and
   comparing the identified user multimodal content preferences to multimodal content in the multimodal content dataset to predict user content preferences of multimodal content in the multimodal content dataset;
   wherein the embedding space is trained using a method comprising:
   for each of a plurality of content of the multimodal content, creating respective first modality vector representations of the content of the multimodal content having a first modality using a machine learning model:
creating a first training set comprising the first modality vector representations;
training the embedding space in a first stage using the first training set by embedding the first modality vector representations in a common embedding space;
for each of a plurality of content of the multimodal content, creating at least respective second modality vector representations of content of the multimodal content having at least a second modality using a machine learning model:
creating a second training set comprising the second modality vector representations;
training the embedding space in a second stage using the second training set by embedding the second modality vector representations in the common embedding space;
creating a respective user vector representation, as a third modality, for each user associated with at least a portion of the multimodal content using information regarding a respective portion of the multimodal content associated with each user;
creating a third training set comprising the third modality vector representations; and
training the embedding space in a third stage using the third training set by embedding the third modality vector representations in the common embedding space:
wherein the first modality vector representations, the at least second modality vector representations and the user vector representations are embedded in the common embedding space using at least a combined loss function which includes a ranking loss component for each modality pair of the first, the at least second and the third modalities that pushes closer co-occurring pairs of multimodal content.

10. The method of claim 9, wherein user content preferences are inferred based on a proximity of the user vector representations to at least one other feature vector embedded in the embedding space.

11. A method for using determined user preferred content, determined using the method of claim 9, for conveying message intents, further comprising:
determining attributes, including at least one of meaning, color, and appearance of a message to be conveyed by the user preferred content, using a first pre-trained embedding space;
determining features of the user preferred content for conveying the message using a second pre-trained embedding space; and
generating content using the determined attributes of the message to be conveyed and the determined features of the user preferred content for conveying the message.

12. The method of claim 11, wherein the generating content comprises at least one of modifying existing content or generating new content.

13. The method of claim 11, wherein the attributes of the message determine an intent of the message to be conveyed by the user preferred content.

14. The method of claim 11, wherein the message comprises at least one of an advertisement, a social media post, content used for marketing, content used for educational purposes, and content used for entertainment.

15. The method of claim 11, wherein the content is generated using an adversarial relationship between a discriminator and a generator.

16. An apparatus for training a neural network for creating a common embedding space for multimodal content for determining user-content associations, comprising:
a processor; and
a memory accessible to the processor, the memory having stored therein at least one of programs or instructions executable by the processor to configure the apparatus to:
create a respective first modality vector representation of the content of the multimodal content having a first modality using a machine learning model for each of a plurality of content of the multimodal content;
create a first training set comprising the first modality vector representations;
train the neural network in a first stage using the first training set by embedding the first modality vector representations in a common embedding space;
create at least a respective second modality vector representation of content of the multimodal content having at least a second modality using a machine learning model for each of a plurality of content of the multimodal content;
create a second training set comprising the second modality vector representations;
train the neural network in a second stage using the second training set by embedding the second modality vector representations in the common embedding space;
create a respective user vector representation, as a third modality, for each user associated with at least a portion of the multimodal content using information regarding a respective portion of the multimodal content associated with each user;
create a third training set comprising the third modality vector representations; and
train the neural network in a third stage using the third training set by embedding the third modality vector representations in the common embedding space;
wherein the first modality vector representations, the at least second modality vector representations and the user vector representations are embedded in the common embedding space using at least a combined loss function which comprises a ranking loss component for each modality pair of the first, the at least second and the third modalities that pushes closer co-occurring pairs of multimodal content.

17. The apparatus of claim 16, wherein, upon identification of a user for which to predict user content preferences of the multimodal content, the apparatus is further configured to:
locate an embedded user vector representation of the identified user in the embedding space;
determine a similarity between the located, embedded user vector representation and embedded vector representations of the first and at least the second modalities in the embedding space using a distance function to identify user multimodal content preferences; and
compare the identified user multimodal content preferences to multimodal content in a multimodal content dataset to predict user content preferences of multimodal content in the multimodal content dataset.

18. The apparatus of claim 17, wherein the multimodal content dataset comprises at least one of advertising content, marketing content, entertainment content, educational content, or social media content.

19. The apparatus of claim 16, wherein the apparatus is further configured to:
   determine attributes including at least one of meaning, color, and appearance of a message to be conveyed by the user preferred content using a first pre-trained embedding space, and determining features of the user preferred content for conveying the message using a second pre-trained embedding space; and
   generate content generator content using the determined attributes of the message to be conveyed and the determined features of the user preferred content for conveying the desired message.

20. The apparatus of claim 16, wherein the user vector representation of a user is created as an arithmetic average of respective first modality vector representations and respective at least second modality vector representations of multimodal content associated with the user.

\* \* \* \* \*